(12) United States Patent
Fukami et al.

(10) Patent No.: US 10,891,892 B2
(45) Date of Patent: Jan. 12, 2021

(54) DISPLAY DEVICE

(71) Applicant: Panasonic Liquid Crystal Display Co., Ltd., Himeji (JP)

(72) Inventors: Tetsuo Fukami, Hyogo (JP); Masahiro Ishii, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 169 days.

(21) Appl. No.: 15/280,554

(22) Filed: Sep. 29, 2016

(65) Prior Publication Data

US 2017/0092182 A1 Mar. 30, 2017

(30) Foreign Application Priority Data

Sep. 30, 2015 (JP) .................... 2015-195072

(51) Int. Cl.
*G09G 3/20* (2006.01)
*G09G 3/36* (2006.01)
*H01L 27/32* (2006.01)

(52) U.S. Cl.
CPC ......... *G09G 3/2085* (2013.01); *G09G 3/3677* (2013.01); *G09G 3/3696* (2013.01); *H01L 27/3223* (2013.01); *H01L 27/3272* (2013.01); *H01L 27/3276* (2013.01); *G09G 2300/0426* (2013.01); *G09G 2300/0814* (2013.01); *G09G 2310/0218* (2013.01)

(58) Field of Classification Search
None
See application file for complete search history.

(56) References Cited

U.S. PATENT DOCUMENTS

2010/0321348 A1* 12/2010 Kim .................... G09G 3/20
345/204
2015/0029081 A1* 1/2015 Kawachi ............. G02F 1/13452
345/92

(Continued)

FOREIGN PATENT DOCUMENTS

JP   2008-077007   4/2008
WO  2013/179537  12/2013

OTHER PUBLICATIONS

Office Action issued in corresponding Japanese Patent Application No. 2015-195072, dated Jun. 25, 2019, 10 pages with translation.

*Primary Examiner* — Andre L Matthews
(74) *Attorney, Agent, or Firm* — Hamre, Schumann, Mueller & Larson, P.C.

(57) ABSTRACT

A display device comprises: selector transistors in each of which one of conductive electrodes is connected to each of ends of gate lines, the selector transistor being divided into a plurality; selection signal supplying wirings each of which is provided in each block, and connected to each control electrode of the selector transistors corresponding to the block; gate voltage supplying wirings that are commonly connected to the other conductive electrode of each of the selector transistors; a gate driver that sequentially supplies a gate voltage to the gate voltage supplying wirings while supplying a control voltage to the selection signal supplying wiring in order to on or off the selector transistor, and a light shielding part that is disposed between at least the two adjacent blocks.

9 Claims, 13 Drawing Sheets

(56) References Cited

U.S. PATENT DOCUMENTS

2016/0070130 A1* 3/2016 Yuminami .......... G02F 1/13452
                                                            349/110
2018/0005595 A1   1/2018 Kawachi et al.
2018/0190234 A1   7/2018 Kawachi et al.
2019/0066619 A1   2/2019 Kawachi et al.

* cited by examiner

DISPLAY DEVICE

CROSS-REFERENCE TO RELATED APPLICATION

This application claims priority from Japanese application JP2015-195072, filed Sep. 30, 2015. This Japanese application is incorporated herein by reference.

TECHNICAL FIELD

The present invention relates to a display device.

BACKGROUND

Nowadays, in a display panel, the number of gate lines increases due to high resolution. With increasing number of gate lines, the number of lead wirings of the gate lines increases to enlarge an area of a frame region. Therefore, for example, Japanese unexamined patent application publication JP2008-77007A discloses a driving system in which the gate lines are scanned in each block (group) while divided into a plurality of blocks. In the driving system of JP2008-77007A, the number of lead wirings of the gate lines is decreased, so that the area of the frame region can be reduced.

SUMMARY

However, in the conventional technology, the following problem occurs. Due to an arrangement of a thin film transistors (TFT) for selecting the gate lines, there are gaps between each neighboring two blocks. In this case, light from a backlight leaks from the gaps. Then, the leakage light enters a display area, as a result, display unevenness such as a transverse strip is observed in a region corresponding to a boundary between the blocks in a display image.

An object of the present disclosure is to reduce the display unevenness in the display device with the driving system that scans the gate lines in each group.

To solve the above problem, a display device according to the present disclosure comprises: a plurality of groups, each group having a plurality of data lines extending in a first direction and a plurality of gate lines extending in a second direction, wherein the plurality of gate lines for each group are adjacent in the first direction; a plurality of blocks, each block including: a plurality of selector transistors and each of the plurality of selector transistors includes: a first conductive electrode connected to an end of a corresponding gate line of the plurality of gate lines, a second conductive electrode, and a control electrode, wherein each block among the plurality of blocks corresponds to a group among the plurality of the groups; a plurality of selection signal supplying wirings each of which is connected to the control electrode of each of the plurality of selector transistors for a corresponding block of the plurality of blocks; a plurality of gate voltage supplying wirings each of which is connected to the second conductive electrode of one of the plurality of selector transistors in each of the groups; and a gate driver that sequentially supplies a gate voltage to the plurality of gate voltage supplying wirings and supplies a control voltage to the plurality of selection signal supplying wirings to turn on or off one or more of the plurality of selector transistors, and a light shielding part that is disposed between at least two adjacent blocks among the plurality of blocks.

In the display device according to the present disclosure, a first block and a second block among the plurality of blocks may be sequentially arranged in a scanning direction, and the light shielding part is disposed between a selector transistor connected to a gate line scanned last in the first block and a selector transistor connected to a gate line scanned first in the second block.

In the display device according to the present disclosure, the control electrodes for each of the plurality of selector transistors included in a block among the plurality of blocks may be formed in one piece.

In the display device according to the present disclosure, the light shielding part may be an extended part of the control electrode of a selector transistor among the plurality of selector transistors.

In the display device according to the present disclosure, the light shielding part may include a dummy transistor that has a control electrode, and the control electrode of each of the plurality of selector transistors included in a first block among the plurality of blocks and the control electrode of the dummy transistor adjacent to the first block are integrally formed.

In the display device according to the present disclosure, the dummy transistor may include a first conductive electrode and a second conductive electrode, wherein each of the plurality of selection signal supplying wirings is not connected to the first conductive electrode and the second conductive electrode of the dummy transistor, and wherein each of the plurality of gate voltage supplying wirings is not connected to the first conductive electrode and the second conductive electrode of the dummy transistor.

In the display device according to the present disclosure, a dummy signal supplying wiring through which a dummy signal is supplied may be connected to a first conductive electrode of each dummy transistor, and a capacitance may be connected to a second conductive electrode of each dummy transistor.

The display device according to the present disclosure may further comprise: a plurality of dummy transistors, each of the dummy transistors including a first conductive electrode and a second conductive electrode; and a dummy signal supplying wiring through which a dummy signal is supplied, wherein the dummy signal supplying wiring is connected to the first conductive electrode of each of the plurality of dummy transistors, and the second conductive electrodes of the plurality of dummy transistors are electrically connected to each other.

In the display device according to the present disclosure, a first conductive electrode of the dummy transistor may be connected to a corresponding gate voltage supplying wiring among the plurality of gate voltage supplying wirings, and a capacitance may be connected to the second conductive electrode of the dummy transistor.

The display device according to the present disclosure may further comprise: a plurality of dummy transistors, each of the dummy transistors including a first conductive electrode and a second conductive electrode; wherein a corresponding gate voltage supplying wiring among the plurality of gate voltage supplying wirings is connected to the first conductive electrode of each of the plurality of dummy transistors, and the second conductive electrodes of the plurality of dummy transistors are electrically connected to each other.

The display device according to the present disclosure may further comprise: a plurality of dummy transistors, each of the dummy transistors including a first conductive electrode and a second conductive electrode; wherein a corresponding gate voltage supplying wiring among the plurality of gate voltage supplying wirings is connected to the first conductive electrode of each of the plurality of dummy transistors, a first capacitance is connected to the second conductive electrode of each dummy transistor corresponding to an odd-numbered block, wherein each block among the plurality of blocks is numerically sorted and the odd-numbered blocks are blocks having an odd number, and a second capacitance is connected to the second conductive electrode of each dummy transistor corresponding to an even-numbered block, wherein the even numbered blocks are blocks having an even number.

The display device according to the present disclosure may further comprise: a plurality of dummy transistors, each of the dummy transistors including a first conductive electrode and a second conductive electrode; wherein a corresponding gate voltage supplying wiring among the plurality of gate voltage supplying wirings is connected to the first conductive electrode of each of the plurality of dummy transistors, the second conductive electrodes of the plurality of dummy transistors corresponding to odd-numbered blocks are electrically connected to each other, wherein each block among the plurality of blocks are numerically sorted and the odd-numbered blocks are blocks having an odd number, and the second conductive electrodes of the plurality of dummy transistors corresponding to even-numbered blocks are electrically connected to each other, wherein the even numbered blocks are blocks having an even number.

In the display device of the present disclosure, the display device with the driving system that scans the gate lines in each group can be reduced.

DETAILED DESCRIPTION

Hereinafter, exemplary embodiments of the present disclosure will be described with reference to the drawings. In the exemplary embodiments, a liquid crystal display device is described as an example of the display device. However the present disclosure is not limited to this. For example the present disclosure may be an organic electroluminescence display (OLED) device. In addition, in the exemplary embodiments, although a liquid crystal display with COG (Chip On Glass) technology is described as an example, the present disclosure is not limited to this. For example, the present disclosure may be a liquid crystal display with COF (Chip On Film) technology or TCP (Tape Carrier Package) technology.

Figure 1:
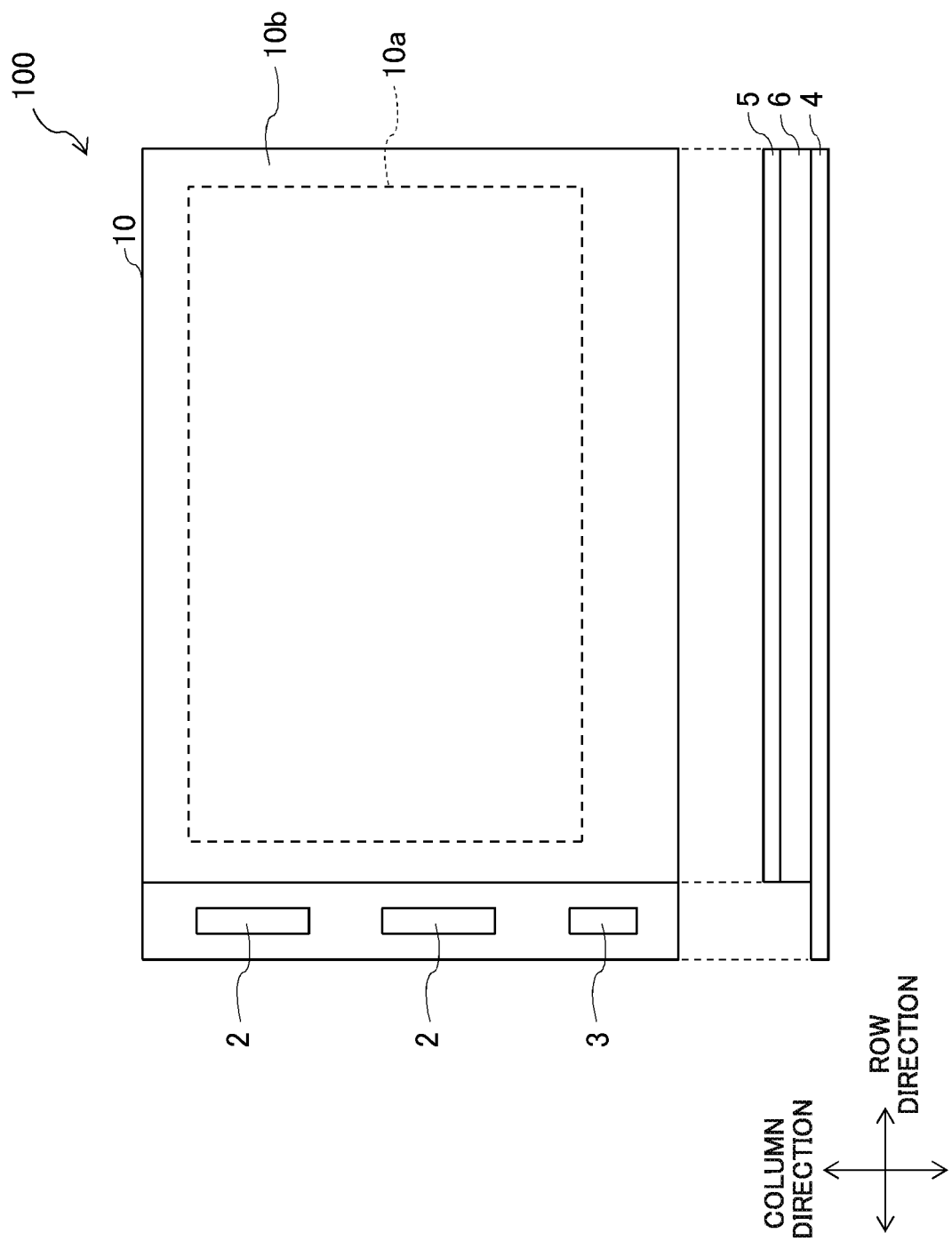
FIG. 1 is plan and side views illustrating a schematic configuration of a liquid crystal display device according to an exemplary embodiment.

FIG. 1 is plan and side views illustrating a schematic configuration of a liquid crystal display device according to an exemplary embodiment. Liquid crystal display device 100 includes display panel 10, source driver IC 2, gate driver IC 3, and a backlight device (not illustrated). Display panel 10 includes thin film transistor substrate 4 (TFT substrate), color-filter substrate 5 (CF substrate), and liquid crystal layer 6 sandwiched between the substrates. Source driver IC 2 and gate driver IC 3 are directly mounted on a glass substrate constituting TFT substrate 4. Source driver IC 2 and gate driver IC 3 are arranged in line along a side of display panel 10. There is no limitation to the numbers of source driver IC2 and gate driver IC3. Display panel 10 includes display region 10a that displays an image and frame region 10b around display region 10a.

Figure 2:
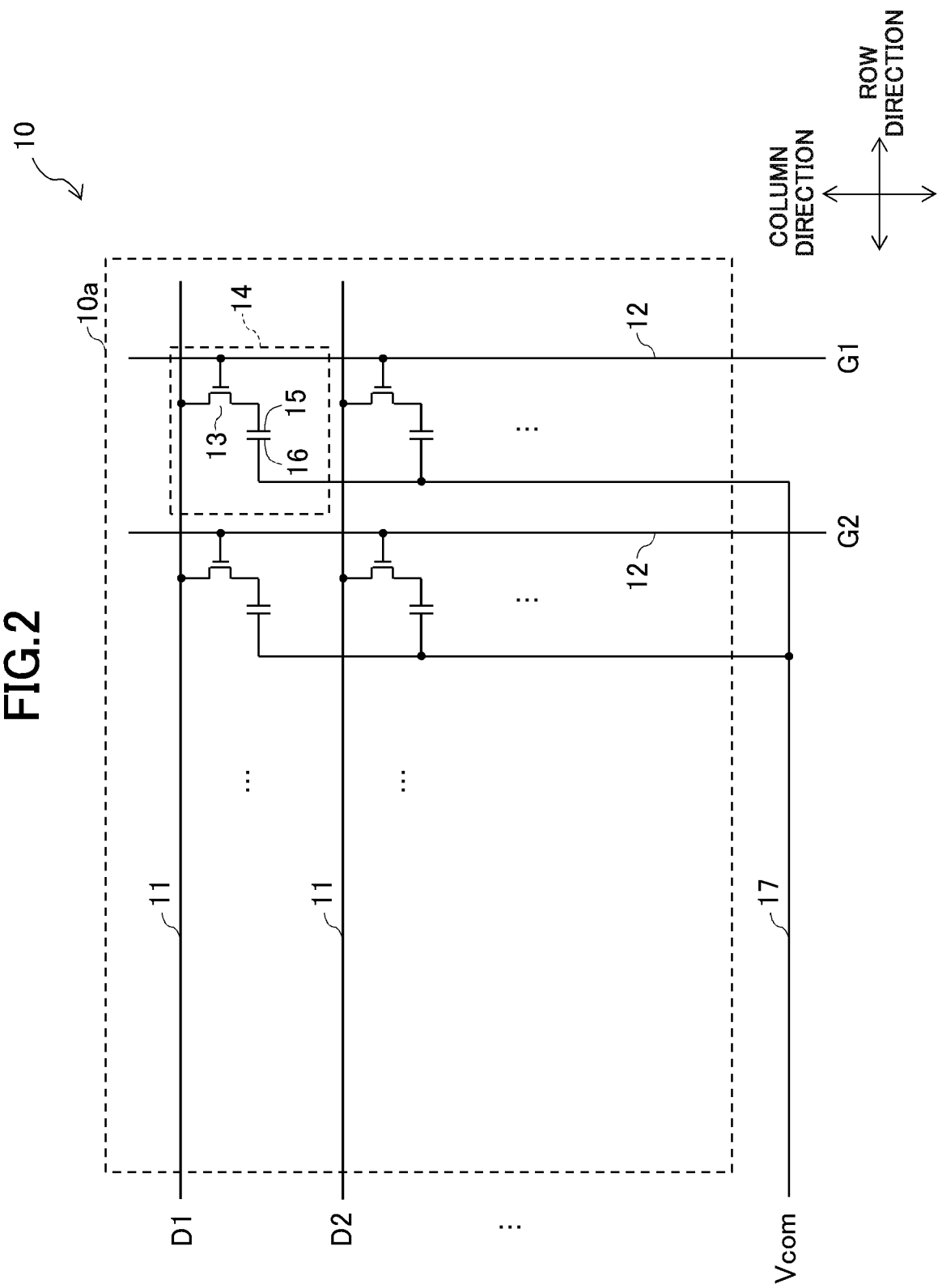
FIG. 2 is a plan view illustrating a schematic configuration of a display panel of the exemplary embodiment.

FIG. 2 is a plan view illustrating a schematic configuration of display region 10a in display panel 10. A plurality of data lines 11 extending in a first direction (for example, a row direction) and a plurality of gate lines 12 extending in a second direction (for example, a column direction) are provided in display panel 10. A thin film transistor (hereinafter, referred to as a pixel TFT) 13 is provided in an intersection portion of each data line 11 and each gate line 12. Each data line 11 is electrically connected to a source driver IC2 (see FIG. 1), and each gate line 12 is electrically connected to a gate driver IC3 (see FIG. 1). First data line D1 is disposed at an end in the column direction of the plurality of data lines 11, and second data line D2 is adjacent to first data line D1 in the column direction. First gate line G1 is disposed at an end in the row direction of the plurality of gate lines 12, and second gate line G2 is adjacent to first gate line G1 in the row direction. First gate line G1 and second gate line G2 is scanned in this order.

In display panel 10, a plurality of pixels 14 are arranged into a matrix shape (in the row and column directions) according to intersection portions of data lines 11 and gate lines 12. A plurality of pixel electrodes 15 disposed in each pixel 14 and a common electrode 16 common to the plurality of pixels 14 are provided in TFT substrate 4. Common electrode 16 may be provided in CF substrate 5.

A data signal (data voltage) is supplied to each data line 11 from corresponding source driver IC 2. A gate signal (a gate-on voltage and a gate-off voltage) is supplied to each gate line 12 from gate driver IC 3. Common voltage Vcom is supplied to common electrode 16 from a common driver (not illustrated) through common wiring 17. When an on voltage (gate-on voltage) of the gate signal is supplied to gate line 12, pixel TFT 13 connected to gate line 12 is turned on to supply the data voltage to pixel electrode 15 through data line 11 connected to pixel TFT 13. An electric field is generated by a difference between the data voltage supplied to pixel electrode 15 and common voltage Vcom supplied to common electrode 16. The liquid crystal is driven by the electric field to control transmittance of light transmitted from a backlight, thereby displaying the image. Desired data voltages are applied to data signal lines 11 connected to pixel electrodes 15 of pixels 14, which are formed by striped color filters to correspond to red, green, and blue, thereby performing color display.

Figure 3:
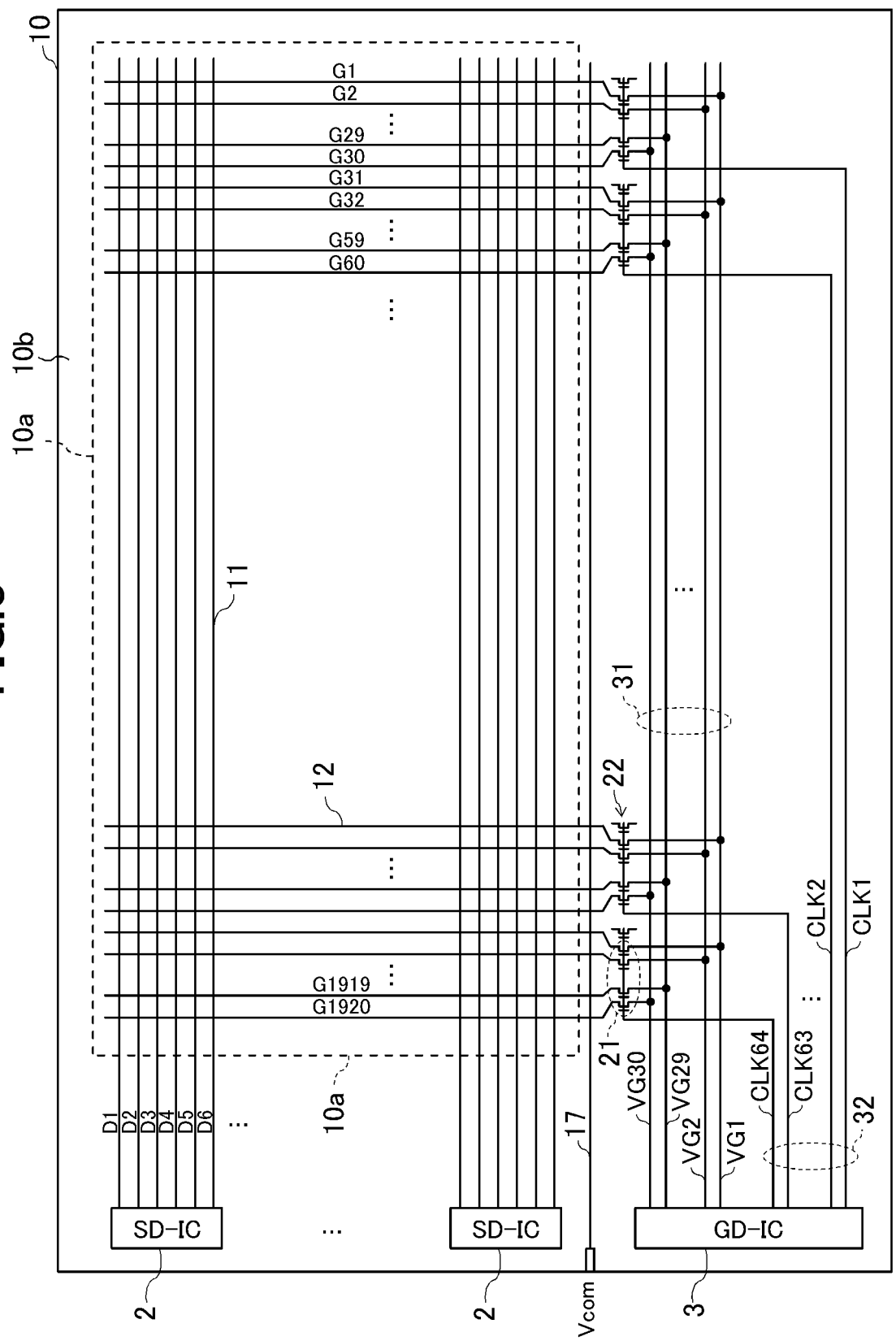
FIG. 3 is a plan view illustrating a detailed configuration of the display panel of the exemplary embodiment.

FIG. 3 is a plan view illustrating a detailed configuration of display panel 10. Source driver IC 2 (SD-IC) electrically connected to one end of each data line 11, gate driver IC 3 (GD-IC) electrically connected to one end of each gate line 12, and terminal Vcom connected to one end of common wiring 17 are disposed in a marginal portion (a left side in FIG. 3) of frame region 10b of display panel 10. The other end of gate line 12 is connected to one of conductive electrodes (source electrode, first conductive electrode) of thin film transistor (hereinafter, referred to as a selector TFT) 21 for selecting gate lines 12, and the other conductive electrode (drain electrode, second conductive electrode) of selector TFT 21 is electrically connected to gate voltage supplying wiring 31. Selector TFT 21 acts as a switch that selects corresponding gate line 12. The plurality of gate lines 12 are electrically connected to one gate voltage supplying wiring 31. Specifically, for example, in the case that the number of gate lines 12 is 1920, 1st, 31st, 61st, . . . , 1891st gate lines G1, G31, G61, . . . , G1891 are connected to gate voltage supplying wiring VG1 through corresponding selector TFTs 21, and 2nd, 32nd, 62nd, . . . , 1892nd gate lines G2, G32, G62, . . . , G1892 are connected to gate voltage supplying wiring VG2 through corresponding selector TFTs 21. Similarly, 30th, 60th, 90th, . . . , 1920th gate lines G30, G60, G90, . . . , G1920 are connected to gate voltage supplying wiring VG30 through corresponding selector TFTs 21. In the example of FIG. 3, gate line 12 is connected to identical gate voltage supplying wiring 31 in each 30 gate lines 12. 64 gate lines 12 are electrically connected to one gate voltage supplying wiring 31. 30 adjacent gate lines 12 connected to gate voltage supplying wirings VG1 to VG30 constitute one group. For example, gate lines G1 to G30 constitute one group (first group), gate lines G31 to G60 constitute one group (2nd group), and gate lines G1891 to G1920 constitute one group (64th group). In the example of FIG. 3, gate line 12 includes 64 groups.

Figure 4:
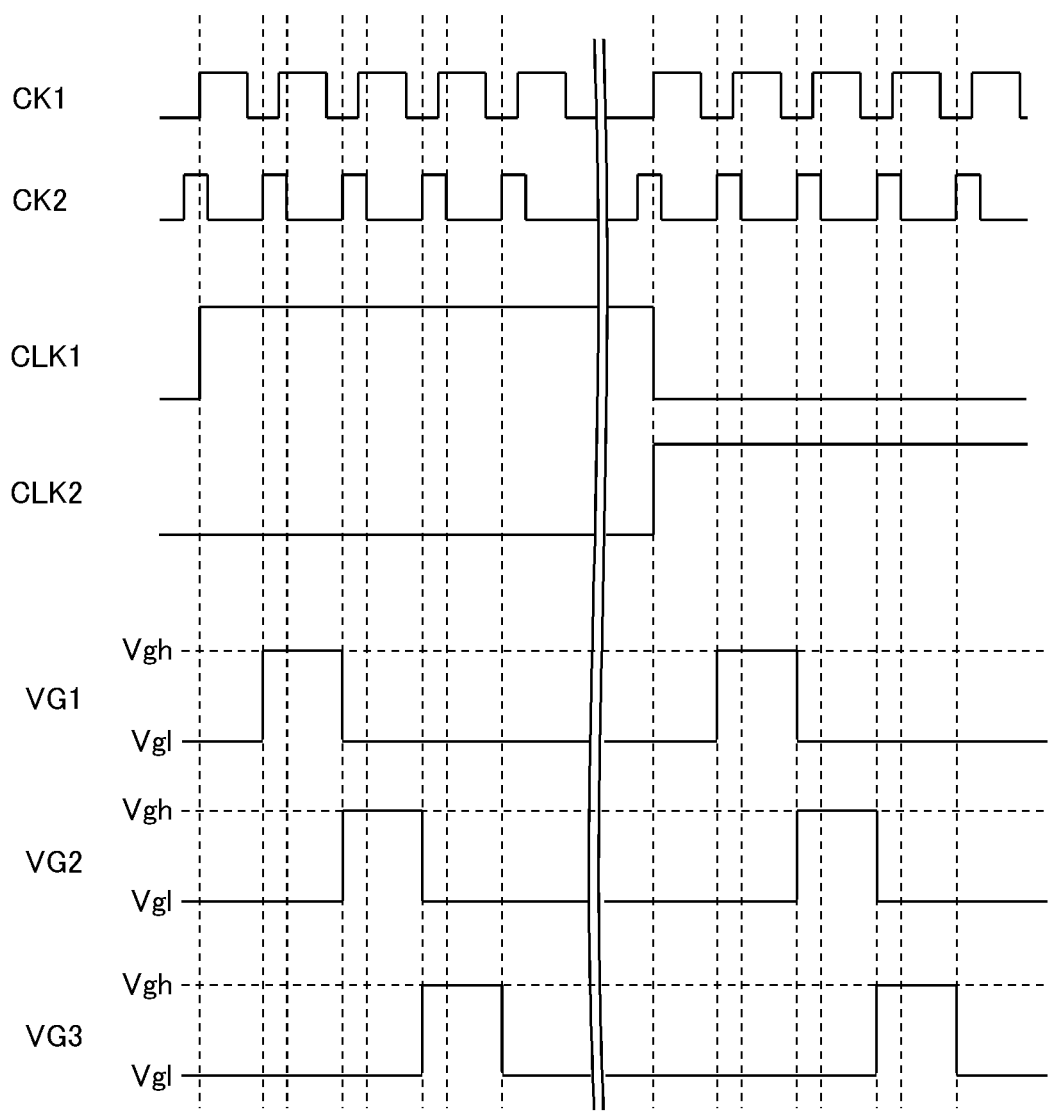
FIG. 4 is a timing chart illustrating an operation of the display panel according to an exemplary embodiment.

Each of the control electrodes (gate electrodes) of 30 selector TFTs 21 corresponding to one group is connected to identical gate selection signal supplying wirings (selection signal supplying wirings) 32 and the control electrodes of 30 selector TFTs 21 corresponding to one group are formed in one piece. A one block consists of a plurality of selector TFTs 21 corresponding to one group. Each block includes 30 selector TFT here. For example, in a first block corresponding to the first group including gate lines G1 to G30, each of the control electrodes of 30 selector TFTs 21 connected to gate lines G1 to G30 is connected to gate selection signal supplying wiring CLK1 and all of the control electrodes of 30 selector TFTs 21 connected to gate lines G1 to G30 are formed in one piece. For example, in a second block corresponding to the second group including gate lines G31 to G60, each of the control electrodes of 30 selector TFTs 21 connected to gate lines G31 to G60 is connected to gate selection signal supplying wiring CLK2 and all of the control electrodes of 30 selector TFTs 21 connected to gate lines G31 to G60 are formed in one piece. Similarly, in the 64th block corresponding to the 64th group including gate lines G1891 to G1920, each of the control electrodes of 30 selector TFTs 21 connected to gate lines G1891 to G1920 is connected to gate selection signal supplying wiring CLK64 and all of the control electrodes of 30 selector TFTs 21 connected to gate lines G1891 to G1920 are formed in one piece. That is, different gate selection signal supplying wiring 32 is provided for each block. An operation of a display panel 10 will be described below. FIG. 4 is a timing chart illustrating the operation of the display panel 10. In FIG. 4, clocks CK1, CK2 are input from control circuit (not illustrated) to gate driver IC 3, voltages CLK1, CLK2 are supplied to gate selection signal supplying wirings CLK1, CLK2, and voltages VG1 to VG30 are supplied to gate voltage supplying wirings VG1 to VG30.

First, at rise timing of clock CK1, gate driver IC 3 supplies voltage (gate-on voltage) to gate selection signal supplying wiring CLK1 to turn on selector TFTs 21. Therefore, 30 selector TFTs 21 of the first block which are connected to gate lines G1 to G30 of the first group are put into an on state. Then, at rise timing of clock CK2, gate driver IC 3 supplies a voltage (gate-on voltage Vgh) to gate voltage supplying wiring VG1 to turn on pixel TFTs 13 (see FIG. 2). Therefore, first-column pixel TFTs 13 connected to gate line G1 are put into the on state, and the data voltage output from source driver IC 2 is supplied to first-column pixel electrodes 15 through data lines 11 connected to pixel TFTs 13. Then, at the rise timing of clock CK2, gate driver IC 3 supplies gate-on voltage Vgh to gate voltage supplying wiring VG2 while supplying a voltage (gate-off voltage Vgl) to gate voltage supplying wiring to turn off pixel TFTs 13. Therefore, first-column pixel TFTs 13 connected to gate line G1 are turned off, second-column pixel TFTs 13 connected to gate line G2 are put into the on state, and the data voltage output from source driver IC 2 is supplied to second-column pixel electrodes 15 through data lines 11 connected to pixel TFTs 13. Thus, in display panel 10, first-group gate lines G1 to G30 are sequentially driven to supply the data voltage to corresponding pixel electrode 15.

Then, at the rise timing of clock CK1, gate driver IC 3 supplies gate-on voltage to gate selection signal supplying wiring CLK2 while supplying voltage (gate-off voltage) to gate selection signal supplying wiring CLK1 to turn off selector TFTs 21. Therefore, 30 selector TFTs 21 of the first block which are connected to first-group gate lines G1 to G30 are turned off, and selector TFTs 21 connected to second-group gate lines G31 to G60 are put into the on state. Then, at the rise timing of clock CK2, gate driver IC 3 supplies gate-on voltage Vgh to gate voltage supplying wiring VG1. Therefore, 31st-column pixel TFTs 13 connected to gate line G31 are put into the on state, and the data voltage output from source driver IC 2 is supplied to 31st-column pixel electrodes 15 through data lines 11 connected to pixel TFTs 13 Then, at the rise timing of clock CK2, gate driver IC 3 supplies gate-on voltage Vgh to gate voltage supplying wiring VG2 while supplying gate-off voltage Vgl to gate voltage supplying wiring VG1. Therefore, 31st-column pixel TFTs 13 connected to gate line G31 are turned off, 32nd-column pixel TFTs 13 connected to gate line G32 are put into the on state, and the data voltage output from source driver IC 2 is supplied to 32nd-column pixel electrodes 15 through data lines 11 connected to pixel TFTs 13. Thus, in display panel 10, second-group gate lines G31 to G60 are sequentially driven to supply the data voltage to corresponding pixel electrode 15.

Hereinafter, in display panel 10, gate lines 12 in each group are sequentially driven to supply the data voltage to corresponding pixel electrode 15. A method for driving display panel 10 with gate-selector type is not limited to the above driving method, can be applied well-known driving method.

In the above configuration, because the number of wirings connected to gate driver IC 3 can be decreased smaller than the number of gate lines 12, the area of the frame region in the column direction can be reduced compared to a configuration in which all gate lines 12 are drawn to the gate driver IC.

Referring to FIG. 3, in display panel 10 of the exemplary embodiment, a dummy thin film transistor (hereinafter, referred to as a dummy TFT) 22 that is not electrically connected to gate line 12 is further disposed between the two adjacent blocks. Specifically, in each block, dummy TFTs 22 are arranged in an opposite direction to the scanning direction with respect to selector TFTs 21 connected to gate lines G1, G31, G61, . . . , G1891 that are scanned first. Dummy TFT 22 includes a gate electrode, a drain electrode, and a source electrode. A gate electrode of dummy TFT 22 has a light shielding property, and is formed integrally with a gate electrode of selector TFT 21. That is, dummy TFT 22 acts as a light shielding part that shields light leaking from a gap between the two adjacent blocks.

There is no particular limitation to the configuration of display panel 10 including dummy TFT 22, but various configurations can be adopted. A specific configuration example of display panel 10 including dummy TFT 22 will be described below.

[First Configuration Example]

Figure 5:
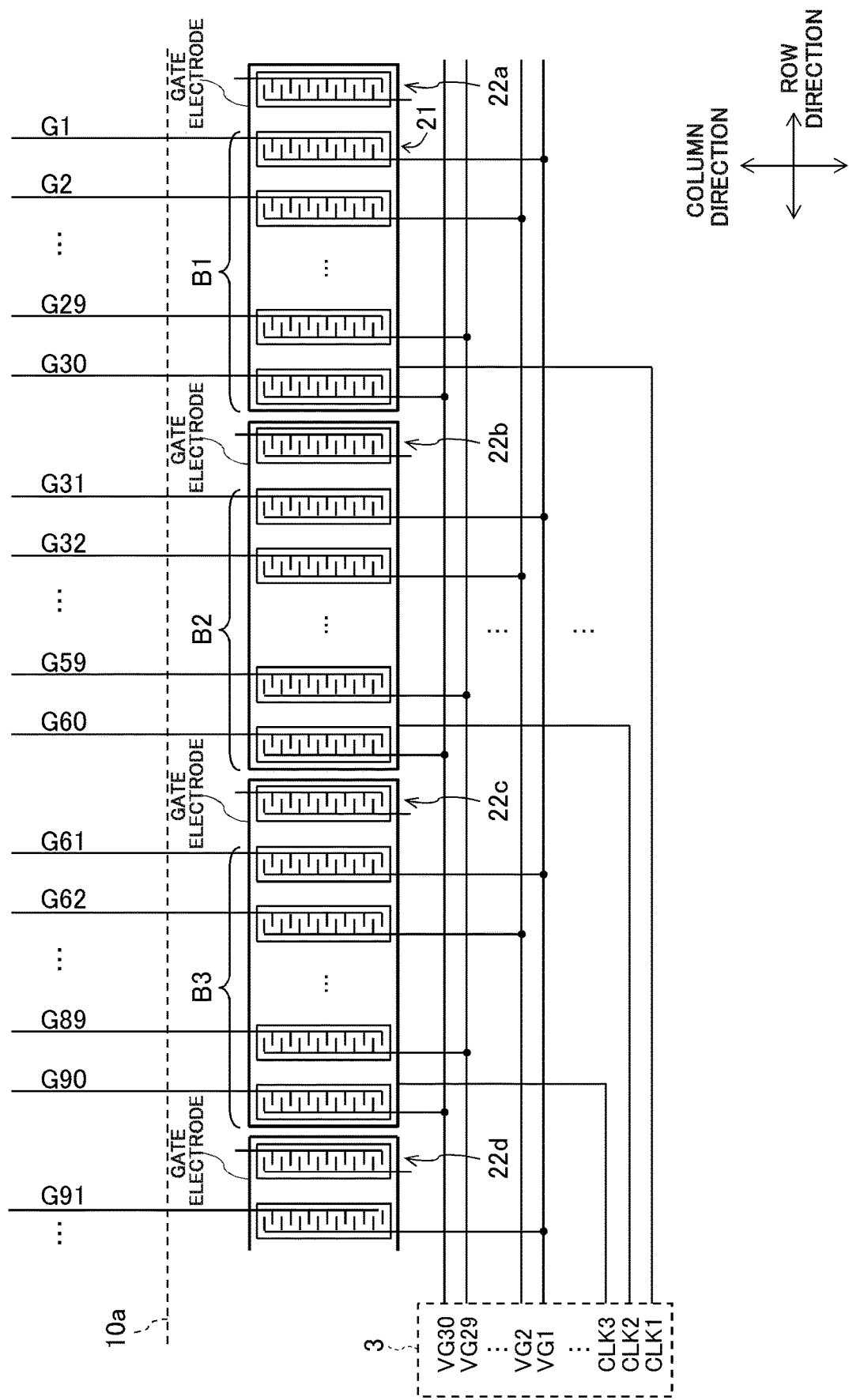
FIG. 5 is a plan view illustrating a detailed configuration of the blocks of the display panel according to a first exemplary configuration.

FIG. 3 illustrates a configuration of display panel 10 according to a first configuration example. FIG. 5 is a plan view illustrating a detailed configuration of display panel 10 of the first configuration example. As illustrated in FIG. 5, in block B1, dummy TFT 22a is disposed in the opposite direction to the scanning direction with respect to selector TFT connected to gate line G1 scanned first. A gate electrode of dummy TFT 22a is formed integrally with a gate electrode of each selector TFT 21 in block B1 while electrically connected to gate selection signal supplying wiring CLK1, but a drain electrode (first conductive electrode) and a source electrode (second conductive electrode) of dummy TFT 22a is connected to any signal line. In other words, each of the plurality of gate lines 12 is not connected to a first conductive electrode and a second conductive electrode of the dummy TFT 22a, and each of the plurality of gate voltage supplying wirings 31 is not connected to a first conductive electrode and a second conductive electrode of dummy TFT 22a. FIG. 5 schematically illustrates the gate electrode common to the plurality of selector TFTs and the drain electrode, source electrode, and semiconductor layer (a-Si), which correspond to each selector TFT. The same holds true for the following drawings. Dummy TFT 22b is disposed between blocks B1, B2. A gate electrode of dummy TFT 22b is formed integrally with a gate electrode of each selector TFT 21 in block B2 while electrically connected to gate selection signal supplying wiring CLK2, but a drain electrode and a source electrode of dummy TFT 22b is not connected to any signal line. Similarly, dummy TFT 22c is disposed between blocks B2, B3. A gate electrode of dummy TFT 22c is formed integrally with a gate electrode of each selector TFT 21 in block B3 while electrically connected to gate selection signal supplying wiring CLK3, but a drain electrode and a source electrode of dummy TFT 22c is not connected to any signal line.

Dummy TFTs 22a, 22b, 22c are arranged in a straight line with selector TFT 21. The gate electrodes of dummy TFTs 22a, 22b, 22c are formed integrally with each of the gate electrodes of selector TFTs 21 of blocks B1, B2, B3, respectively.

In the above configuration, the light leaking from the gap between the blocks is shielded, so that a transverse strip caused by the leak light can be prevented from occurring.

[Second Configuration Example]

Figure 6:
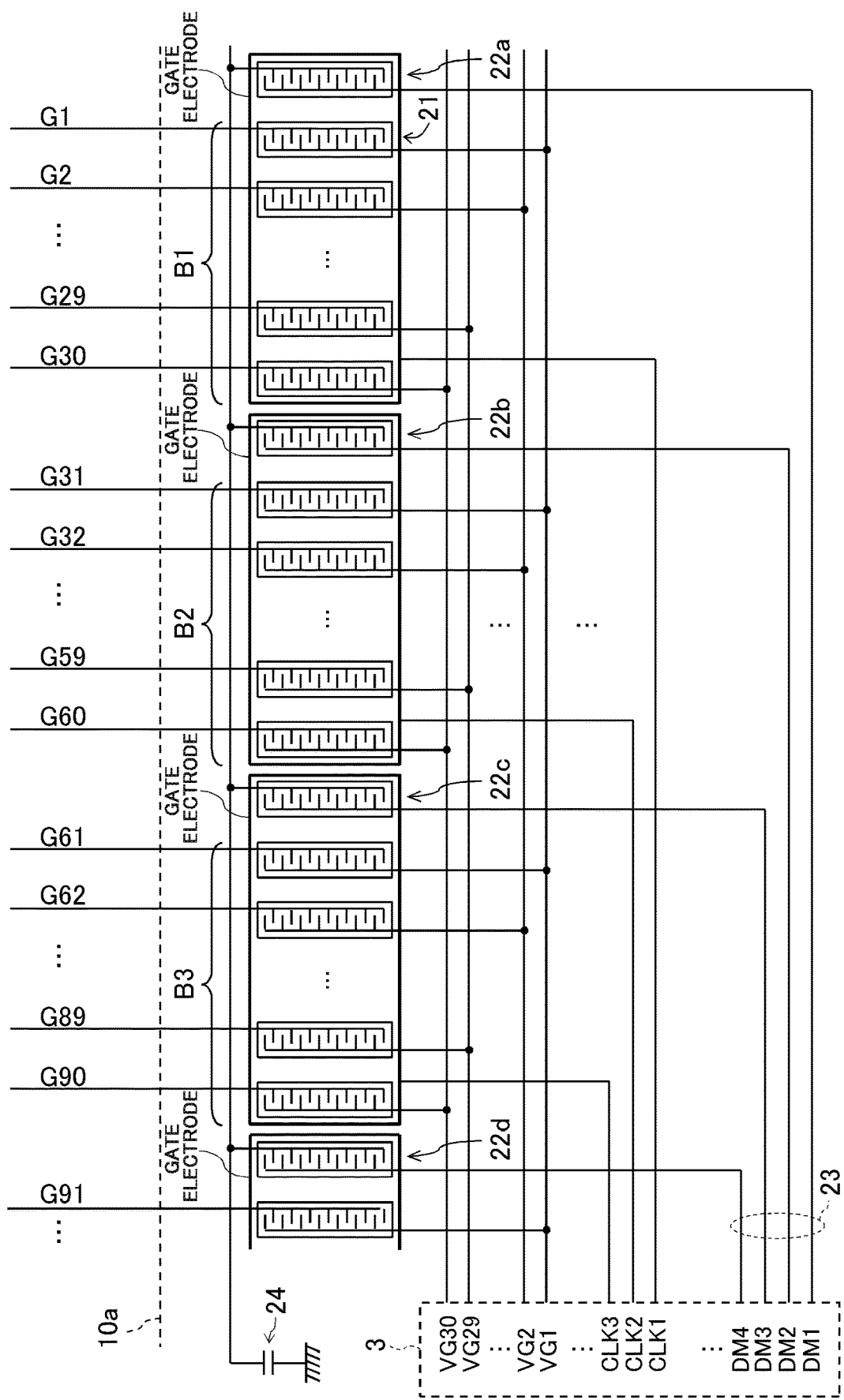
FIG. 6 is a plan view illustrating a detailed configuration of the blocks of the display panel according to a second exemplary configuration.

FIG. 6 is a plan view illustrating a detailed configuration of the block of display panel 10 according to a second configuration example. In the configuration of display panel 10 of the second configuration example, dummy signal supplying wiring 23 through which a dummy signal having a predetermined voltage is supplied and capacitance 24 are added to display panel 10 of the first configuration example in FIG. 5. The dummy signal may be the gate-on voltage or a voltage lower than the gate-on voltage. A gate electrode of dummy TFT 22a is formed integrally with a gate electrode of each selector TFT 21 in block B1 while electrically connected to gate selection signal supplying wiring CLK1, a drain electrode of dummy TFT 22a is connected to dummy signal supplying wiring DM1, and a source electrode of dummy TFT 22a is connected to capacitance 24. A gate electrode of dummy TFT 22b is formed integrally with a gate electrode of each selector TFT 21 in block B2 while electrically connected to gate selection signal supplying wiring CLK2, a drain electrode of dummy TFT 22b is connected to dummy signal supplying wiring DM2, and a source electrode of dummy TFT 22b is connected to capacitance 24. A gate electrode of dummy TFT 22c is formed integrally with a gate electrode of each selector TFT 21 in block B3 while electrically connected to gate selection signal supplying wiring CLK3, a drain electrode of dummy TFT 22c is connected to dummy signal supplying wiring DM3, and a source electrode of dummy TFT 22c is connected to capacitance 24. In the second configuration example, because capacitance 24 acts as a load capacitance of each dummy TFT 22, current is passed through each dummy TFT 22 to generate heat. Particularly, a heating value of each of selector TFTs 21 connected to gate lines G1, G31, G61, . . . , G1891 scanned first in the blocks can be brought close to heating values of other selector TFTs 21. Therefore, the transverse strip caused by the leak light can be prevented from occurring, and the transverse strip caused by the heat generation can be prevented from occurring.

[Third Configuration Example]

Figure 7:
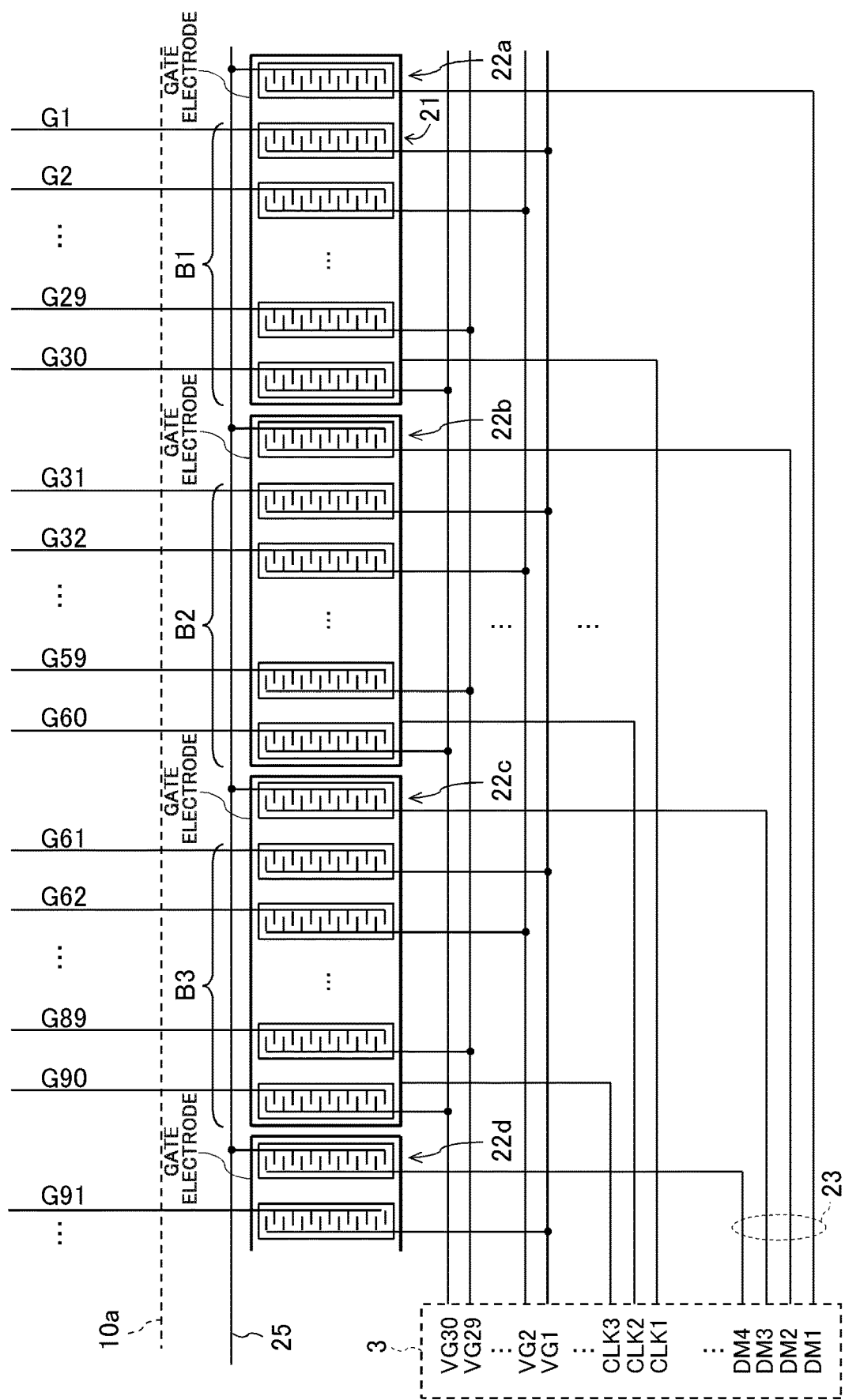
FIG. 7 is a plan view illustrating a detailed configuration of the blocks of the display panel according to a third exemplary configuration.

FIG. 7 is a plan view illustrating a detailed configuration of the block of display panel 10 according to a third configuration example. In the configuration of display panel 10 of the third configuration example, dummy signal supplying wiring 23 and dummy wiring 25 are added to display panel 10 of the first configuration example in FIG. 5. A gate electrode of dummy TFT 22a is formed integrally with a gate electrode of each selector TFT 21 in block B1 while electrically connected to gate selection signal supplying wiring CLK1, a drain electrode of dummy TFT 22a is connected to dummy signal supplying wiring DM1, and a source electrode of dummy TFT 22a is connected to dummy wiring 25. A gate electrode of dummy TFT 22b is formed integrally with a gate electrode of each selector TFT 21 in block B2 while electrically connected to gate selection signal supplying wiring CLK2, a drain electrode of dummy TFT 22b is connected to dummy signal supplying wiring DM2, and a source electrode of dummy TFT 22b is connected to dummy wiring 25. A gate electrode is formed integrally with a gate electrode of each selector TFT 21 in block B3 while electrically connected to gate selection signal supplying wiring CLK3, a drain electrode of dummy TFT 22*c* is connected to dummy signal supplying wiring DM3, and a source electrode of dummy TFT 22*c* is connected to dummy wiring 25. A signal is not supplied to dummy wiring 25, but dummy wiring 25 is disposed in a floating state. In the third configuration example, for example, dummy TFT 22*a* corresponding to block B1 is connected to dummy TFT 22*b* corresponding to block B2 and dummy TFT 22*c* corresponding to block B3 through dummy wiring 25, and dummy TFTs 22*b*, 22*c* have the same function as the load capacitance in FIG. 6, whereby the current is passed through dummy TFT 22*a* to generate the heat. Therefore, similarly to the second configuration example, the transverse strip caused by the heat generation can be prevented from occurring.

[Fourth Configuration Example]

Figure 8:
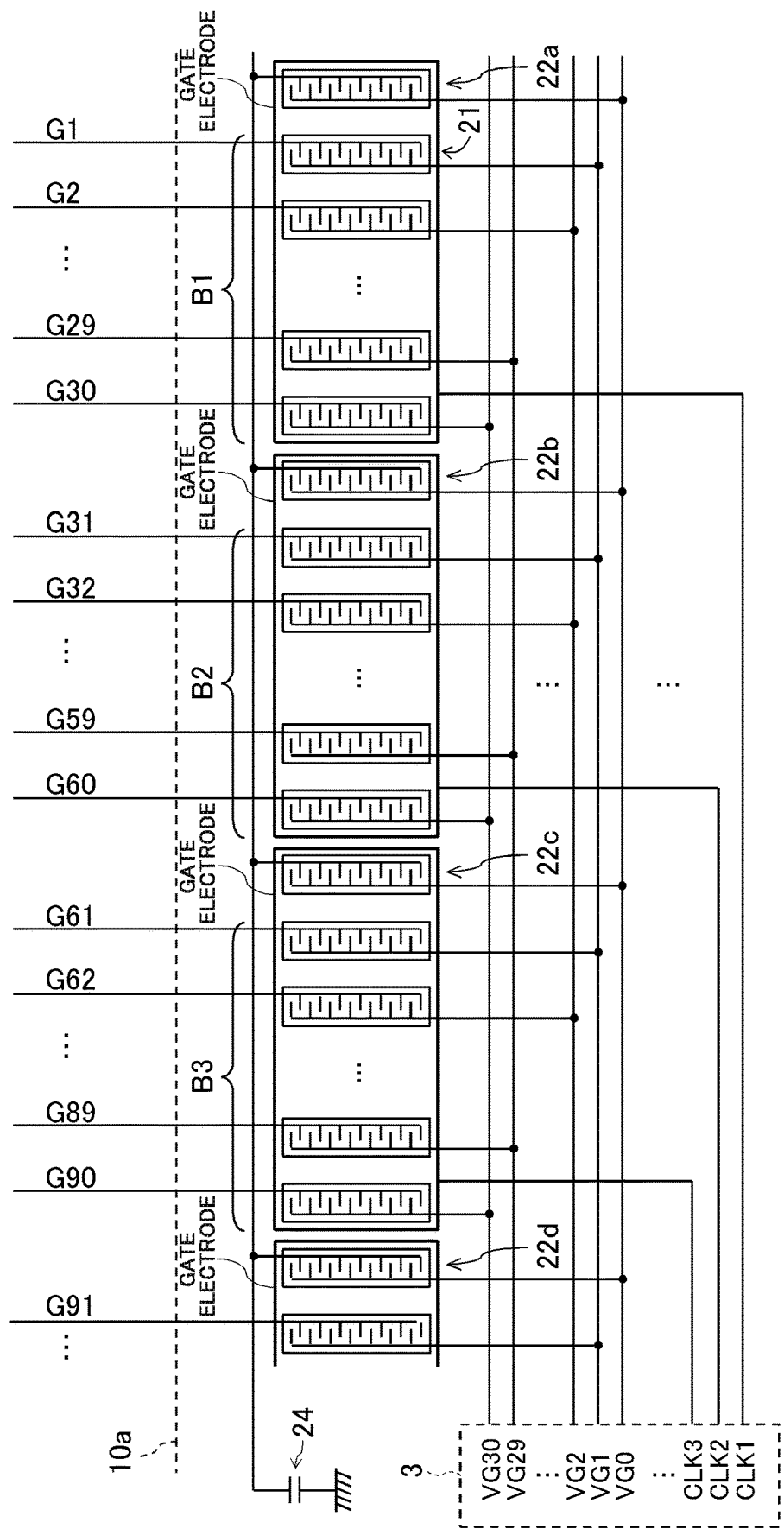
FIG. 8 is a plan view illustrating a detailed configuration of the blocks of the display panel according to a fourth exemplary configuration.

FIG. 8 is a plan view illustrating a detailed configuration of the block of display panel 10 according to a fourth configuration example. In the configuration of display panel 10 of the fourth configuration example, gate voltage supplying wiring VG0 and capacitance 24 are added to display panel 10 of the first configuration example in FIG. 5. A gate electrode of dummy TFT 22*a* is formed integrally with a gate electrode of each selector TFT 21 in block B1 while electrically connected to gate selection signal supplying wiring CLK1, a drain electrode of dummy TFT 22*a* is connected to gate voltage supplying wiring VG0, and a source electrode of dummy TFT 22*a* is connected to capacitance 24. A gate electrode of dummy TFT 22*b* is formed integrally with a gate electrode of each selector TFT 21 in block B2 while electrically connected to gate selection signal supplying wiring CLK2, a drain electrode of dummy TFT 22*b* is connected to gate voltage supplying wiring VG0, and a source electrode of dummy TFT 22*b* is connected to capacitance 24. A gate electrode of dummy TFT 22*c* is formed integrally with a gate electrode of each selector TFT 21 in block B3 while electrically connected to gate selection signal supplying wiring CLK3, a drain electrode of dummy TFT 22*c* is connected to gate voltage supplying wiring VG0, and a source electrode of dummy TFT 22*c* is connected to capacitance 24. In the fourth configuration example, the gate-on voltage is sequentially supplied to the drain electrodes of dummy TFTs 22 in scanning order of selector TFT 21. Because capacitance 24 acts as the load capacitance of each dummy TFT 22, the current is passed through each dummy TFT 22 to generate heat. Therefore, similarly to the second configuration example, the transverse strip caused by the heat generation can be prevented from occurring.

[Fifth Configuration Example]

Figure 9:
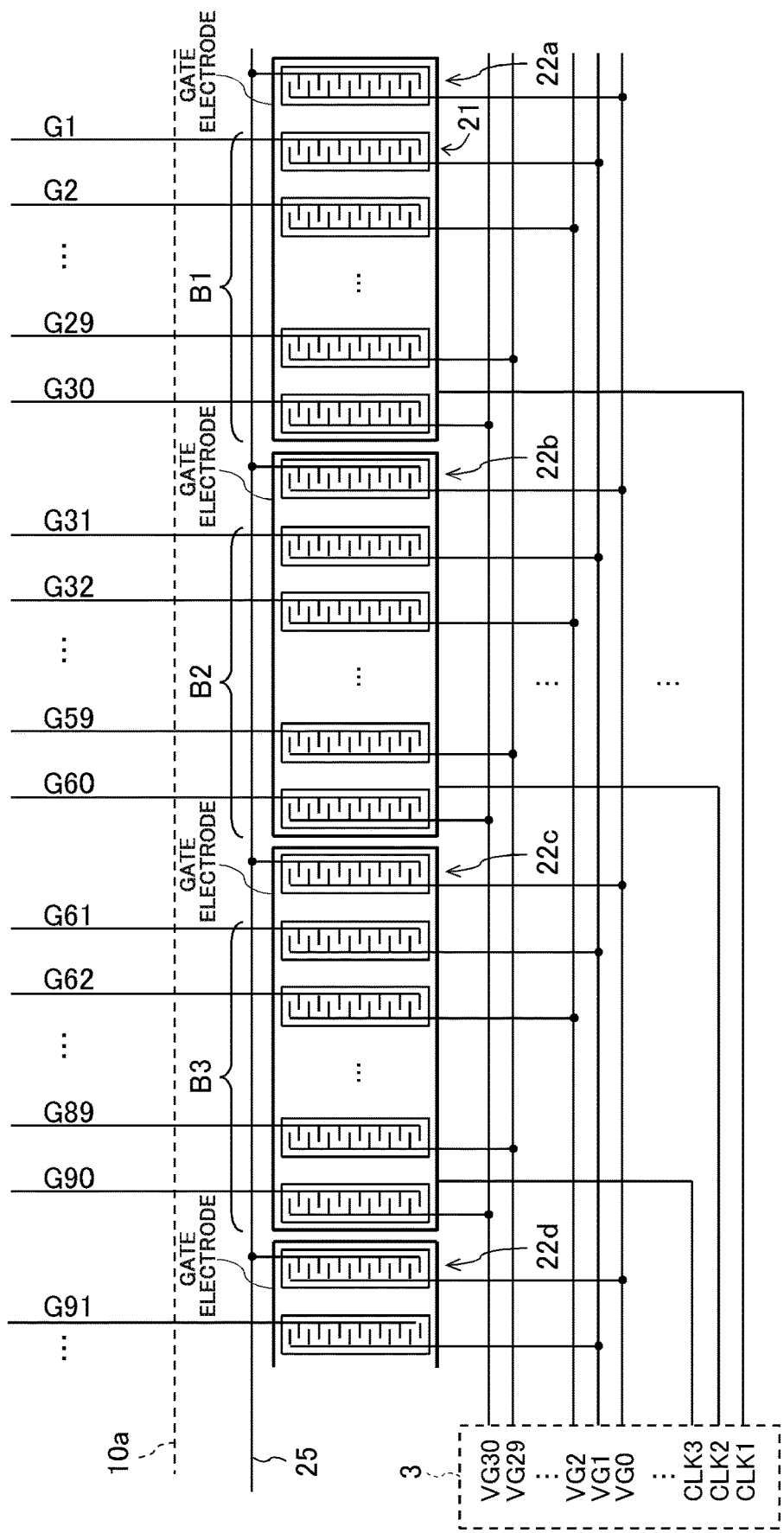
FIG. 9 is a plan view illustrating a detailed configuration of the blocks of the display panel according to a fifth exemplary configuration.

FIG. 9 is a plan view illustrating a detailed configuration of the block of display panel 10 according to a fifth configuration example. In the configuration of display panel 10 of the fifth configuration example, gate voltage supplying wiring VG0 and dummy wiring 25 are added to display panel 10 of the first configuration example in FIG. 5. A gate electrode of dummy TFT 22*a* is formed integrally with a gate electrode of each selector TFT 21 in block B1 while electrically connected to gate selection signal supplying wiring CLK1, a drain electrode of dummy TFT 22*a* is connected to gate voltage supplying wiring VG0, and a source electrode of dummy TFT 22*a* is connected to dummy wiring 25. A gate electrode of dummy TFT 22*b* is formed integrally with a gate electrode of each selector TFT 21 in block B2 while electrically connected to gate selection signal supplying wiring CLK2, a drain electrode of dummy TFT 22*b* is connected to gate voltage supplying wiring VG0, and a source electrode of dummy TFT 22*b* is connected to dummy wiring 25. A gate electrode of dummy TFT 22*c* is formed integrally with a gate electrode of each selector TFT 21 in block B3 while electrically connected to gate selection signal supplying wiring CLK3, a drain electrode of dummy TFT 22*c* is connected to gate voltage supplying wiring VG0, and a source electrode of dummy TFT 22*c* is connected to dummy wiring 25. In the fifth configuration example, the gate-on voltage is sequentially supplied to the drain electrodes of dummy TFTs 22 in scanning order of selector TFT 21. Additionally, in the fifth configuration example, for example, dummy TFT 22*a* corresponding to block B1 is connected to dummy TFT 22*b* corresponding to block B2 and dummy TFT 22*c* corresponding to block B3 through dummy wiring 25, and dummy TFTs 22*b*, 22*c* have the same function as the load capacitance in FIG. 6, whereby the current is passed through dummy TFT 22*a* to generate the heat. Therefore, similarly to the second configuration example, the transverse strip caused by the heat generation can be prevented from occurring.

In the first to fifth configuration examples, dummy TFT 22 (light shielding part) is disposed between the two adjacent blocks. However, the exemplary embodiment is not limited to the first to fifth configuration examples. For example, dummy TFTs 22 may be disposed between the two adjacent blocks and at a predetermined position in each block. For example, in the case that a gap exists between two adjacent selector TFTs 21, dummy TFT 22 may be disposed in the gap between two adjacent selector TFTs 21. The above configuration can be applied to the first to fifth configuration examples.

Figure 10:
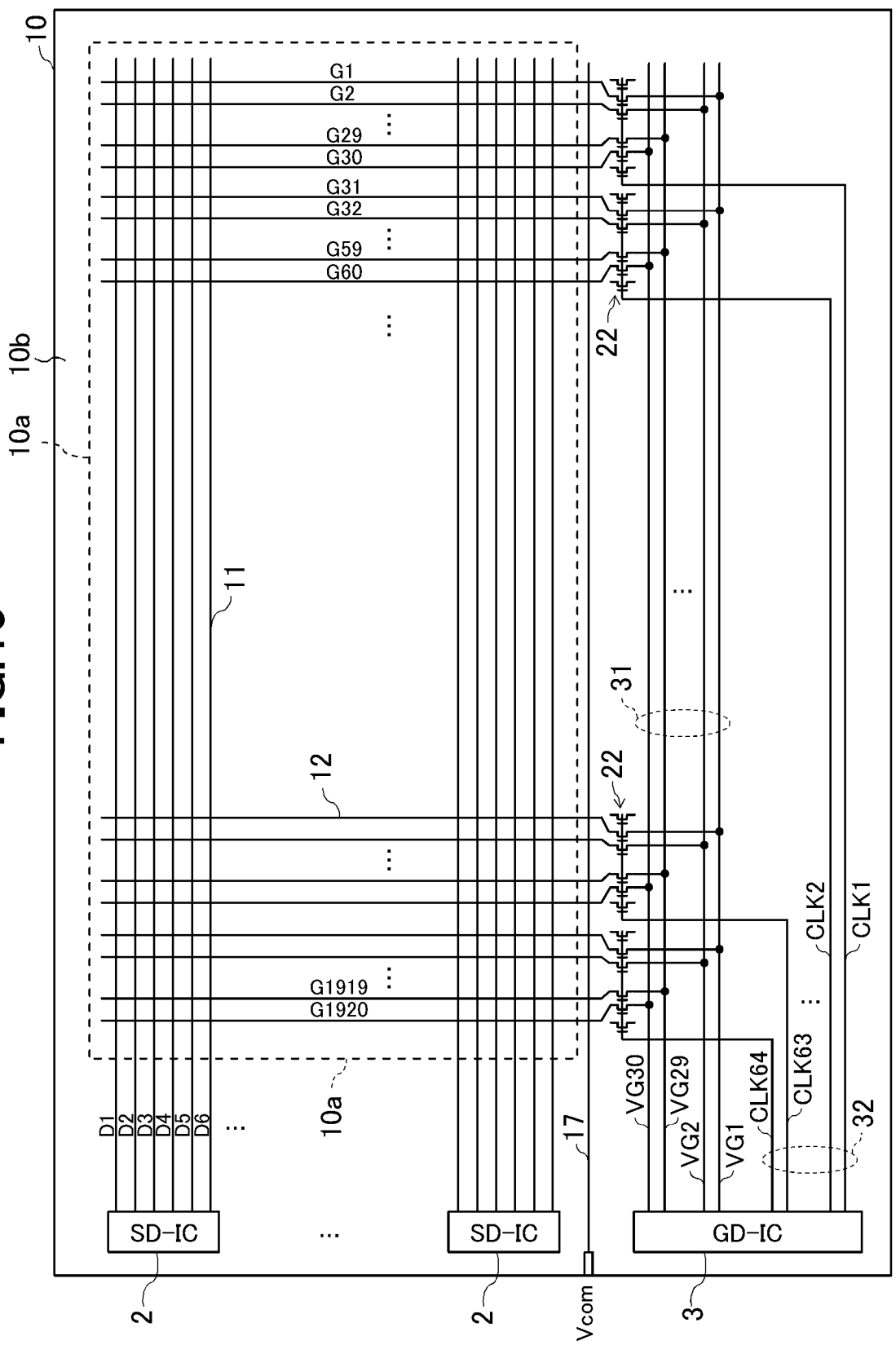
FIG. 10 is a plan view illustrating another configuration of a display panel of the exemplary embodiment.

In the first to fifth configuration examples, dummy TFT 22 is disposed in a head (front) position of each block. However, the exemplary embodiment is not limited to the first to fifth configuration examples. For example, as illustrated in FIG. 10, dummy TFTs 22 may be disposed at the head and final (last) positions in each block. The configuration in FIG. 10 corresponds to the first configuration example. However, the configuration in FIG. 10 can also be applied to the second to fifth configuration examples. In the above configuration, the transverse strip caused by the leak light can be prevented from occurring irrespective of the scanning direction.

In the first to fifth configuration examples, selector TFT 21 and dummy TFT 22 are provided on one end side of gate line 12. However, selector TFT 21 and dummy TFT 22 may be provided on both end sides of gate line 12. That is, the exemplary embodiment can be applied to a display panel with a system that drives gate line 12 from both ends.

Figure 11:
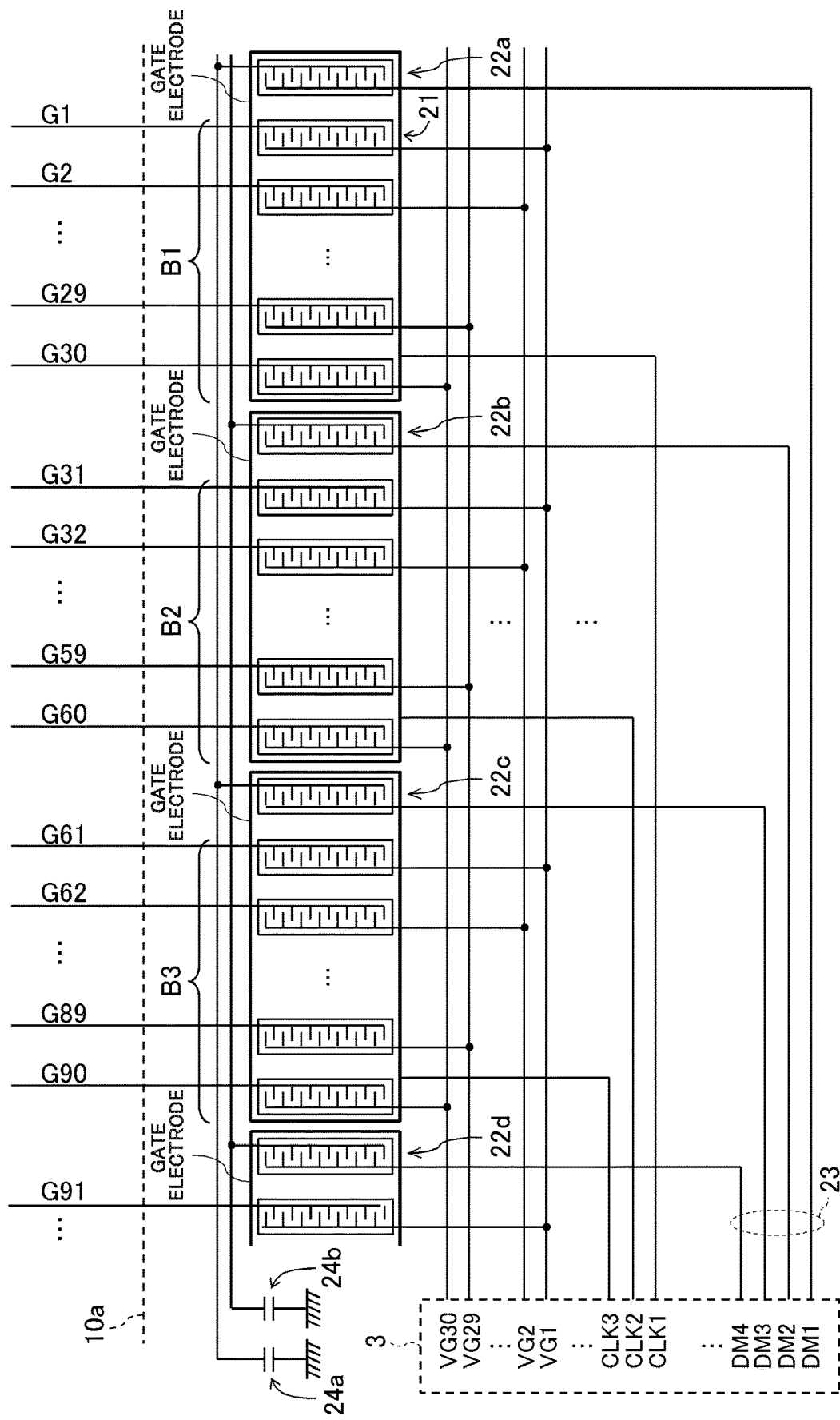
FIG. 11 is a plan view illustrating a configuration of the display panel of a variation.

In the second configuration example (see FIG. 6) and the fourth configuration example (see FIG. 8), the source electrode of each dummy TFT 22 is connected to one capacitance 24. However, display panel 10 of the exemplary embodiment is not limited to the second and fourth configuration examples. For example, as illustrated in FIG. 11, in display panel 10, the source electrodes of the dummy TFTs (such as 22*a*, 22*c*) corresponding to odd-numbered blocks (such as B1, B3) may be connected to capacitance 24*a* (first capacitance), and the source electrodes of the dummy TFTs (such as 22*b*, 22*d*) corresponding to even-numbered blocks (such as B2, B4) may be connected to capacitance 24*b* (second capacitance). The two adjacent dummy TFTs can be electrically separated from each other, so that a defect that is caused by electrically connecting the two adjacent dummy TFTs to each other because the dummy TFTs are simultaneously put into the on state can be prevented in the configuration in which the gate-on voltage is simultaneously supplied to two adjacent gate selection signal supplying wirings CLK to drive the corresponding gate line. FIG. 11 illustrates an example applied to the configuration in FIG. 6, and the example in FIG. 11 can also be applied to the configuration in FIG. 8.

Figure 12:
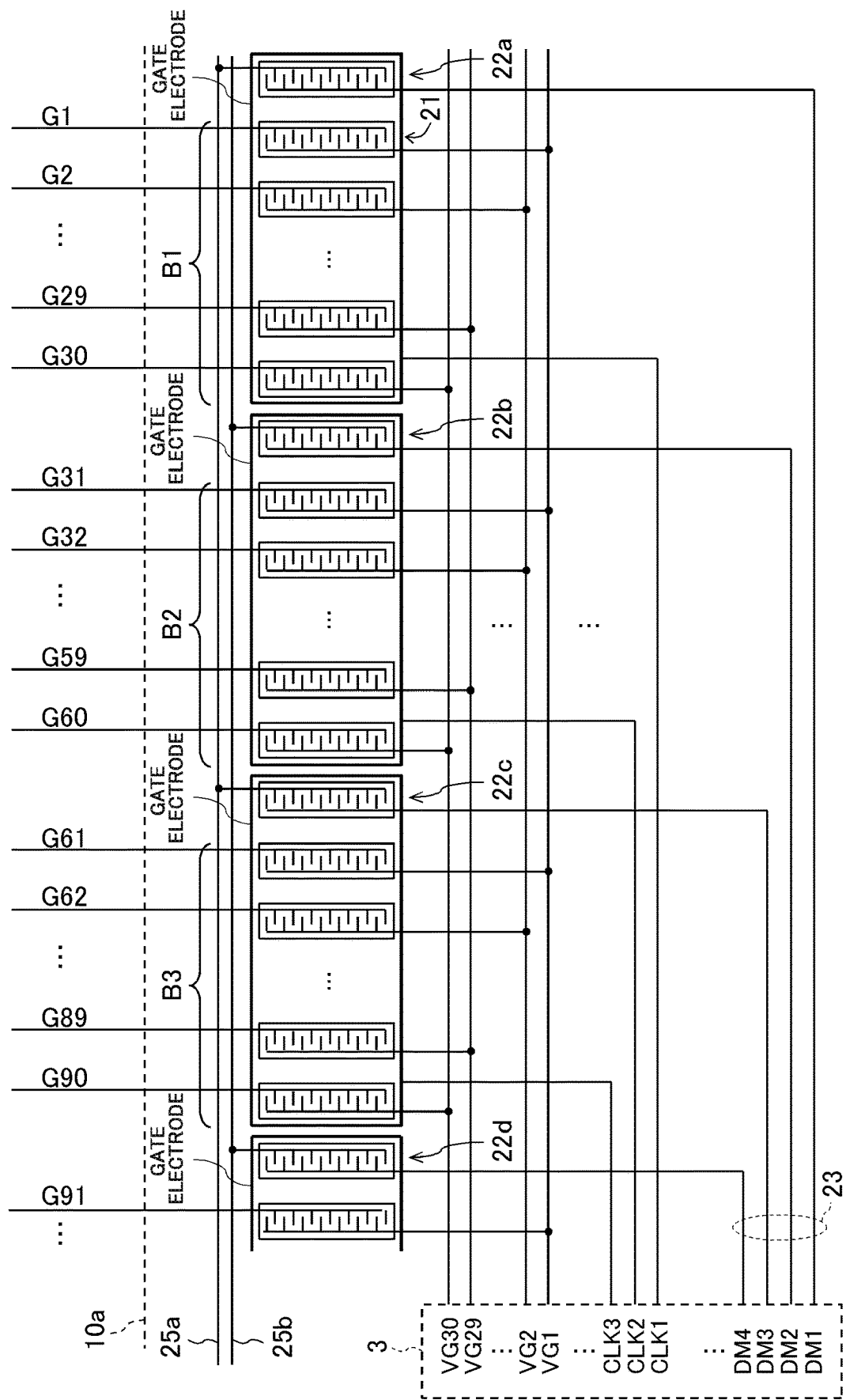
FIG. 12 is a plan view illustrating a configuration of the display panel of a variation.

Similarly, in the third configuration example (see FIG. 7) and the fifth configuration example (see FIG. 9), the source electrode of each dummy TFT 22 is connected to one dummy wiring 25. However, the exemplary embodiment is not limited to the third and fifth configuration examples. For example, as illustrated in FIG. 12, in display panel 10, the source electrodes of the dummy TFTs (such as 22a, 22c) corresponding to the odd-numbered blocks (such as B1, B3) may be connected to dummy wiring 25a, and the source electrodes of the dummy TFTs (such as 22b, 22d) corresponding to the even-numbered blocks (such as B2, B4) may be connected to dummy wiring 25b. Therefore, the source electrodes of the dummy TFTs corresponding to the odd-numbered blocks are electrically connected to each other, and the source electrodes of the dummy TFTs corresponding to the even-numbered blocks are electrically connected to each other. The two adjacent dummy TFTs can be electrically separated from each other, so that a defect that is caused by electrically connecting the two adjacent dummy TFTs to each other because the dummy TFTs are simultaneously put into the on state can be prevented in the configuration in which the gate-on voltage is simultaneously supplied to two adjacent gate selection signal supplying wirings CLK to drive the corresponding gate line. FIG. 12 illustrates an example applied to the configuration in FIG. 7, and the example in FIG. 12 can also be applied to the configuration in FIG. 9.

Figure 13:
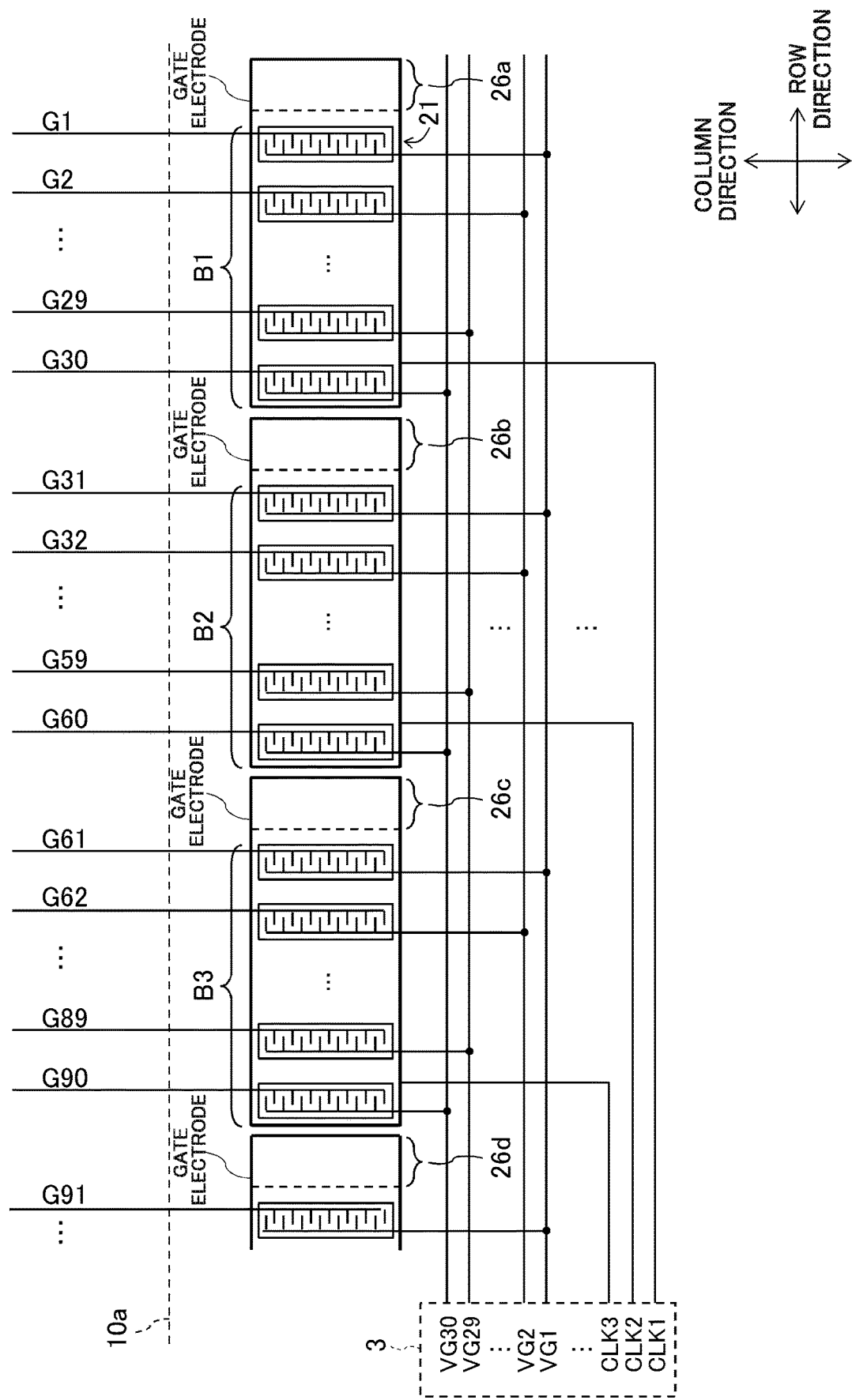
FIG. 13 is a plan view illustrating a configuration of the display panel of a variation.

As described above, in display panel 10 of the exemplary embodiment, the light shielding part is disposed between at least two adjacent blocks. The light shielding part is not limited to dummy TFTs 22 of the first to fifth configuration examples. For example, the light shielding part may be gate electrode extended part 26 that is of a region where the gate electrode of the selector transistor is extended. FIG. 13 is a plan view illustrating a configuration of display panel 10 in the case that gate electrode extended part 26 is used in the first configuration example.

In the above, the specific embodiments of the present application have been described, but the present application is not limited to the above-mentioned embodiments, and various modifications may be made as appropriate without departing from the spirit of the present application.

What is claimed is:

1. A display device, comprising:
   a plurality of data lines extending in a first direction;
   a plurality of groups, each group having a plurality of gate lines extending in a second direction, wherein the plurality of gate lines for each group are adjacent in the first direction;
   a plurality of blocks, each block including:
      a plurality of selector transistors and each of the plurality of selector transistors includes:
         a first conductive electrode connected to an end of a corresponding gate line of the plurality of gate lines,
         a second conductive electrode, and
         a control electrode,
      wherein each block among the plurality of blocks corresponds to a group among the plurality of the groups;
   a plurality of selection signal supplying wirings, each of which is connected to the control electrode of each of the plurality of selector transistors for a corresponding block of the plurality of blocks;
   a plurality of gate voltage supplying wirings each of which is connected to the second conductive electrode of one of the plurality of selector transistors in each of the groups;
   a gate driver that sequentially supplies a gate voltage to the plurality of gate voltage supplying wirings and supplies a control voltage to the plurality of selection signal supplying wirings to turn on or off one or more of the plurality of selector transistors; and
   a dummy transistor having a control electrode and being disposed between two adjacent blocks among the plurality of blocks,
   wherein the plurality of blocks include a first block and a second block next to the first block,
   the first conductive electrodes of the plurality of selector transistors included in the first block are connected to the ends of the corresponding gate lines respectively,
   the first conductive electrodes of the plurality of selector transistors included in the second block are connected to the ends of the corresponding gate lines respectively,
   the dummy transistor is disposed between one of the plurality of selector transistors in the first block and one of the plurality of selector transistors in the second block,
   the control electrode of each of the plurality of selector transistors included in the first block and the control electrode of the dummy transistor disposed between the first block and the second block are integrally formed, and
   the control electrode of the dummy transistor disposed between the first block and the second block is electrically isolated from and spaced apart from the control electrode of each of the plurality of selector transistors included in the second block.

2. The display device according to claim 1, wherein the first block and the second block among the plurality of blocks are sequentially arranged in a scanning direction, and a light shielding part is disposed between a selector transistor connected to a gate line scanned last in the first block and a selector transistor connected to a gate line scanned first in the second block.

3. The display device according to claim 1, wherein the control electrodes for each of the plurality of selector transistors included in a block among the plurality of blocks are integrally formed.

4. The display device according to claim 1, further comprising a light shielding part that is an extended part of the control electrode of a selector transistor among the plurality of selector transistors.

5. The display device according to claim 1, wherein the dummy transistor includes a first conductive electrode and a second conductive electrode, wherein each of the plurality of selection signal supplying wirings is not connected to the first conductive electrode and the second conductive electrode of the dummy transistor, and wherein each of the plurality of gate voltage supplying wirings is not connected to the first conductive electrode and the second conductive electrode of the dummy transistor.

6. The display device according to claim 1, wherein a dummy signal supplying wiring through which a dummy signal is supplied is connected to a first conductive electrode of each dummy transistor, and a capacitance is connected to a second conductive electrode of each dummy transistor.

7. The display device according to claim 1, wherein a first conductive electrode of the dummy transistor is connected to a corresponding gate voltage supplying wiring among the plurality of gate voltage supplying wirings, and a capacitance is connected to the second conductive electrode of the dummy transistor.

8. The display device according to claim 1, wherein the plurality of selector transistors for each block are adjacent in the first direction and at least partially overlap when viewed in the first direction.

9. The display device according to claim 1, further comprising:
a second dummy transistor having a control electrode and being disposed between two adjacent blocks among the plurality of blocks, wherein
the plurality of blocks include a third block next to the second block, the first conductive electrodes of the plurality of selector transistors included in the third block being connected to the ends of the corresponding gate lines respectively,
the first block, the second block, and the third block are arranged in this order,
the second dummy transistor is disposed between one of the plurality of selector transistors in the second block and one of the plurality of selector transistors in the third block,
the control electrode of each of the plurality of selector transistors included in the second block and the control electrode of the second dummy transistor disposed between the second block and the third block are integrally formed, and
the control electrode of the second dummy transistor disposed between the second block and the third block is electrically isolated from and spaced apart from the control electrode of each of the plurality of selector transistors included in the third block.

* * * * *